United States Patent [19]

Raskin

[11] 4,171,855
[45] Oct. 23, 1979

[54] MULTI-POSITION ELECTRONIC COMPONENT MOUNTING

[76] Inventor: Jef Raskin, 10696 Flora Vista, Cupertino, Calif. 95014

[21] Appl. No.: 803,879

[22] Filed: Jun. 6, 1977

[51] Int. Cl.² .............................................. H05K 1/08
[52] U.S. Cl. ............................. 339/17 C; 339/17 CF; 339/275 B; 339/278 M; 361/405; 357/68
[58] Field of Search ............. 339/17 R, 17 C, 17 CF, 339/17 M, 17 N, 4, 31 R, 147 P, 176 MP, 275 B, 278 M; 29/62 G; 361/404, 405; 174/68.5

[56] References Cited

U.S. PATENT DOCUMENTS

| 2,431,198 | 11/1947 | Posen | 339/17 R |
| 3,217,283 | 11/1965 | Shlesinger, Jr. | 339/278 M |
| 3,239,720 | 3/1966 | Rayburn | 339/17 C |
| 4,003,625 | 1/1977 | Vladic | 339/176 MP |

FOREIGN PATENT DOCUMENTS 154901 6/1956 Sweden ................... 339/66 R

OTHER PUBLICATIONS

IBM Tech. Discl. Bulletin, Schultz, vol. 6, No. 3, p. 79, 8-1963.

Primary Examiner—Neil Abrams
Attorney, Agent, or Firm—Ronald E. Grubman

[57] ABSTRACT

An electronic component is provided having mounting leads configured as concentric arcs centered about a desired axis of rotation. The leads may therefore be inserted into a mounting board, and the component rotated to a desired angle with respect to the surface of the mounting board. In some embodiments, one or more of the mounting leads is provided with tabs or other positioning elements to facilitate the positioning of the component at any of a number of selected angles relative to the mounting board.

13 Claims, 7 Drawing Figures

MULTI-POSITION ELECTRONIC COMPONENT MOUNTING

BACKGROUND OF THE INVENTION

In the design and manufacture of electronic devices and systems, it is now common practice to utilize electronic components which are directly mounted on printed circuit (PC) boards; the boards themselves are subsequently mounted in the system or device housing. This scheme tends to reduce the complexity and cost of assembly, and to simplify servicing procedures. Typical components of the kind referred to above are fabricated with a number of straight mounting leads or "legs" extending outwardly from the component. These legs are inserted into slots in the PC board so that the component is mounted essentially flat against the PC board. However, in numerous applications there has arisen the requirement that at least some components be mounted at an angle relative to the surface of the PC board. For example, in some light emitting diode (LED) optical displays, the LED chips must be mounted at an angle to the printed circuit board in order to provide appropriate viewing of the display. Typically, this is now done by mounting the LED chips on a separate circuit board which is tilted at an angle to the main circuit board. Harnesses or other flexible cable must then be used to electrically interconnect the two circuit boards, all of which entails undesirable assembly complexity and costs.

In order to provide such angular mounting some prior art dual inline integrated circuit (IC) sockets are presently manufactured in which the mounting leads each have an angular bend. Thus, when the leads are inserted into a PC board, the component will be tilted relative to the PC board at an angle determined by the angular bend in the leads. It is a disadvantage of such packages, however, that only one specific mounting angle is available for each package; thus, a large number of different packages, each having a different angular bend in the leads, must be manufactured and stocked if it is desired to mount components at differing angles.

SUMMARY OF THE INVENTION

In accordance with the illustrated preferred embodiments, the present invention provides a scheme for simply and easily mounting electronic components at any of a large number of angles relative to the plane of a printed circuit board or other mounting board. This is accomplished by configuring the mounting leads for the component as a sequence of concentric arcs of increasing radius. The leads are inserted into slots in a mounting board and rotated about the geometric center of the concentric arcs until the component is in a desired angular position. Soldering of the leads to the mounting board fixes the component at this desired position.

In accordance with certain of the preferred embodiments of the invention, one or more of the mounting leads may also include break-off tabs or other geometric irregularities to maintain the component at the desired mounting angle prior to soldering.

DETAILED DESCRIPTION OF THE INVENTION

Figure 1:
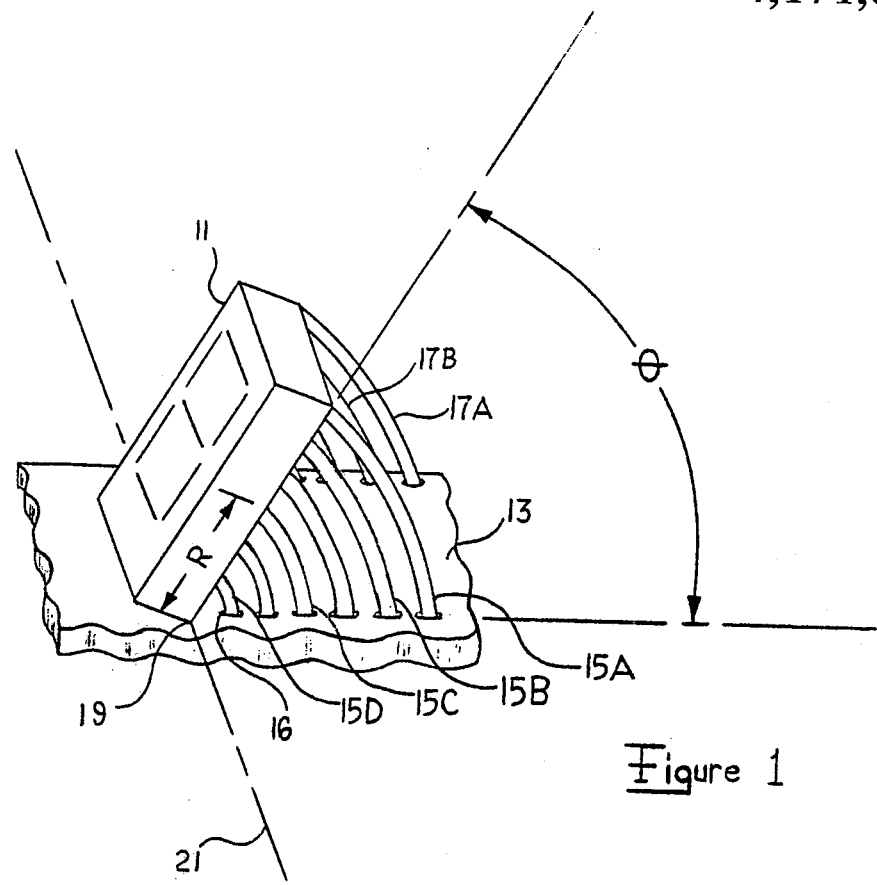
FIG. 1 shows an electronic component having mounting leads configured in accordance with aspects of the invention.

In FIG. 1 there is illustrated an electronic component 11 which for purposes of illustration is shown as one digit of an opto-electronic display such as a dual inline package (DIP) for a seven-segment LED display. The invention will also have applicability to other kinds of board-mounting components, such as IC sockets, switches and the like. Component 11 is mounted on a board 13, which may, for example, be a printed circuit (PC board, and is illustrated as being positioned at an angle $\theta$ with respect to the planar surface of PC board 13. Component 11 includes a number of mounting leads extending from each side of the package. The leads extending from the right side of the package are labeled 15A–15D, while several leads extending from the left-hand side are illustratively labeled 17A and 17B.

In accordance with the principles of the present invention, each of the leads 15A–15D is configured as an arc of a circle having a center at point 19 (the intersection of a center line 21 with one corner of package 11). For example lead 15C comprises an arc of a circle having a radius R as shown. The radii of each of the other leads are similarly determined by the distance of the lead from point 19. Leads 17A etc. on the left side of package 11 are configured in a similar manner. To mount component 11 on board 13, each lead is first inserted in a slot of board 13 (e.g. lead 15D is inserted in slot 16). Component 11 is then rotated about center line 21 until it is positioned at the desired angle $\theta$. The leads are then soldered or attached in any conventional manner to permanently fix the mounting angle. From FIG. 1 it is evident that component 11 may be rotated through 90° from an angle substantially equal to zero to an angle substantially perpendicular to board 13. Thus, in addition to the inclined mounting positions possible, the component may also be conventionally flat mounted ($\theta=0$) if desired.

In FIG. 1 the right side leads are configured as arcs having centers at point 19, chosen as one corner of component 11, and similarly for the left side leads. However, it is evident that the leads could also be configured as a sequence of concentric arcs about a different geometric center, e.g. somewhere below the component itself. The principles of the invention will still apply, but in this case the body of component 11 would "float" above the PC board after mounting. Other variations are also possible. For example, the leads may be configured as portions of a curve other than a circle, in which case the component would be positioned by a "rotational" movement determined by the particular curve of the leads.

Figure 2:
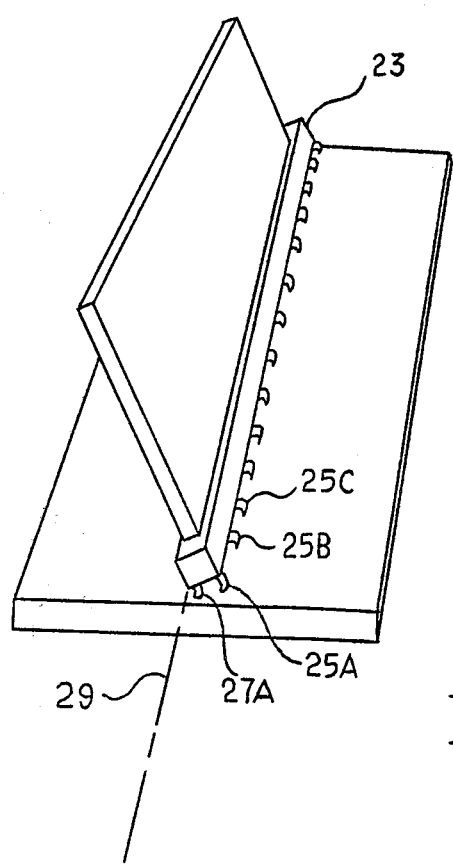
FIG. 2 shows a printed circuit card edgeconnector also having leads configured in accordance with aspects of the invention.

FIG. 2 shows a printed circuit card edge-connector 23 including a number of leads, some of which are labeled 25A–25C (right side) and 27A (left side) which are formed as arcs centered about a center line 29 extending along one bottom edge of connector 23. In this case all of the leads running along the left side of the connector (27A etc.) have a first radius, while all of the leads running along the right side of the connector (25A, 25B etc.) have a second radius larger than the first. FIG. 2 therefore illustrates that the leads may be formed in the shape of arcs lying in the plane of the short dimension of the package to be mounted as well as in the plane of the long dimension as in FIG. 1. In accordance with this principle, the DIP package illustrated in FIG. 1 could alternatively have the arc of the leads lying in the short dimension of that package. This arrangement would allow tilted mounting of the package at varying angles from a center line extending along the long dimension of package 11. Additionally, tilted mounting at varying angles about other axes would also be possible if the mounting leads were suitably shaped.

In FIG. 3A there is again illustrated a package 31 including several arc-shaped mounting leads labeled 33A, 33B, and 33C. Lead 33C includes a number of small breakoff lugs 35 positioned at different angles around the periphery of the arc. To mount the component at a desired angle, the user simply breaks off all of the tabs below the particular tab corresponding to a desired mounting angle. Thus, when the leads are inserted into a mounting the component 31 will be freely rotatable until the first remaining lug encounters the surface of the PC board. The position of this lug will therefore determine the mounting angle. Although package 31 is illustrated here as including breakoff lugs on its outermost lead, it is evident that a similar purpose may also be affected with the lugs on some other lead.

Figure 3A:
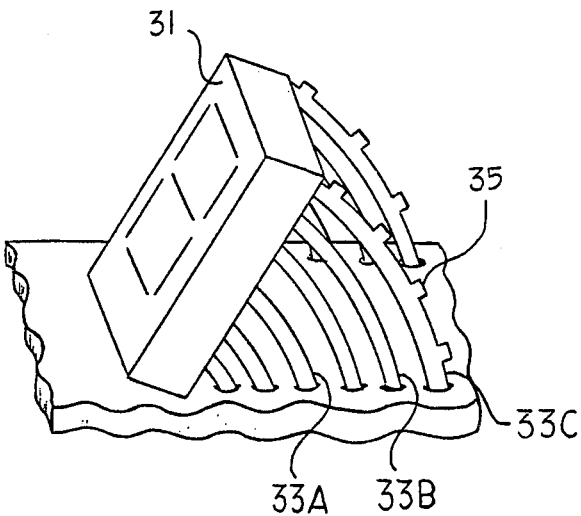
FIGS. 3A–3E illustrate mounting leads including different types of positioning elements.
Figure 3B:
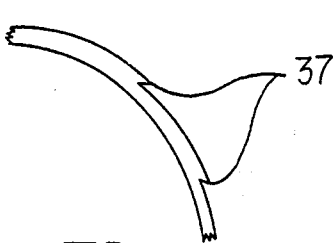

FIG. 3B illustrates a mounting lead including a number of point-like extended portions 37 serving a similar function to lugs 35 of FIG. 3A. In this case, points 37 would be inserted in slightly oversized slots in a mounting board until a desired mounting angle was attained; the point corresponding to the desired angle will then rest on the surface of the PC board. In this embodiment, points 37 provide a ratchet-like effect, so that the component may be easily rotated backwards, withdrawing the leads from the slots in the board, in the event that the initial positioning happened to overshoot the desired angle.

Figure 3C:
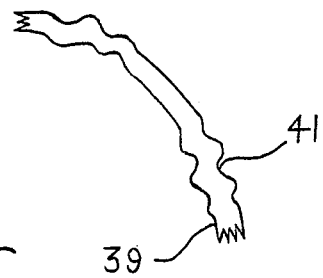

In FIG. 3C an arc-like mounting lead 39 is shown including a number of "wiggles" 41 spaced at desired angles around the arc. If lead 39 is constructed to have a slight tension extending in an outwardly radial direction, then at the points determined by wiggles 41, lead 39 will tend to "latch" itself to a mounting board. Positioning at a desired angle is thereby facilitated.

Figure 3D:
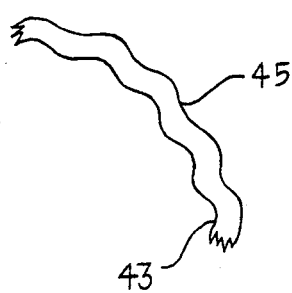

In FIG. 3D there is shown yet another arc-like lead 43 including a number of substantially continuous wiggles 45. In this case lead 43 may be tensioned either inwardly or outwardly so that it will tend to latch on either the inward or outward radial side of any of the wiggles 45.

Figure 3E:
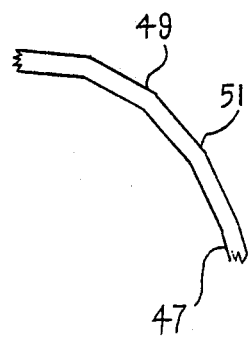

In FIG. 3E, still another arc-like lead 47 is formed as a many-sided polygon having typical sides 49 and 51. Thus, the component may be incrementally rotated through many angular positions corresponding to the various intersections or flats of the polygonal sides.

Those skilled in the art will understand from FIGS. 3A-3E that many other particular designs may be employed to facilitate positioning of the electrical component at desired angles with respect to a mounting board.

What is claimed is:

1. An electronic component to be mounted on a mounting surface, said component comprising:
   a housing;
   at least one mounting lead extending from the housing and configured for rotatable insertion into said mounting surface to permit rotation of the component through a range of angles from said mounting surface; and
   positioning means on said at least one mounting lead for facilitating the positioning of the component at a plurality of preselected angles within the range of angles.

2. An electronic component as in claim 1 wherein:
   each of the mounting leads is configured as an arc of a circle.

3. An electronic component as in claim 1 wherein:
   the positioning means comprises a plurality of removable tabs positioned around the mounting lead at the preselected angles.

4. An electronic compoenent as in claim 1 wherein:
   the positioning means comprises a plurality of point-like extended portions at the preselected angles around the arc of the mounting lead.

5. An electronic component as in claim 1 wherein:
   the positioning means comprises a plurality of wiggles at the preselected angles around the arc of the mounting lead.

6. An electronic component as in claim 1 wherein:
   the positioning means comprises a plurality of polygonal sides, the intersection of pairs of such sides being at the preselected angles around the arc of the mounting lead.

7. An electronic component to be mounted on a mounting surface, said component comprising:
   a housing;
   at least one row of mounting leads extending from the housing, each lead being positioned at an increasing distance from an axis of rotation and being configured as an arc of a circle having a radius equal to the distance of that lead from the axis of rotation;
   the axis of rotation being located at a point on the housing which is in contact with the surface of the mounting board.

8. An electronic component as in claim 7 wherein:
   said electronic component comprises a dualinline integrated circuit package.

9. An electronic component as in claim 7 wherein:
   at least one mounting lead includes positioning means for facilitating the positioning the component at a plurality of preselected angles.

10. An electronic component as in claim 9 wherein:
    the positioning means comprises a plurality of removable tabs positioned around the arc of the mounting lead at the preselected angles.

11. An electronic component as in claim 9 wherein:
    the positioning means comprises a plurality of point-like extended portions at the preselected angles around the arc of the mounting lead.

12. An electronic component as in claim 9 wherein:
    the positioning means comprises a plurality of wiggles at the preselected angles around the arc of the mounting lead.

13. An electronic component as in claim 9 wherein:
    the positioning means comprises a plurality of polygonal sides, the intersection of pairs of such sides being at the preselected angles around the arc of the mounting lead.

* * * * *